United States Patent [19]

Sid-Ahmed et al.

[11] Patent Number: 5,122,788

[45] Date of Patent: Jun. 16, 1992

[54] METHOD AND AN APPARATUS FOR 2-D FILTERING A RASTER SCANNED IMAGE IN REAL-TIME

[75] Inventors: Maher A. Sid-Ahmed, 12703 Riverside Dr. East, Tecumseh, Ontario, Canada, N8B 1A7; Herbert J. Kaufman, 1084 Marjorie Dr., Windsor, Ontario, Canada, N8S 4A3

[73] Assignees: Maher A. Sid-Ahmed; Herbert J. Kaufman, Tecumseh, Canada

[21] Appl. No.: 427,749

[22] Filed: Oct. 27, 1989

[51] Int. Cl.$^5$ .............................................. G09G 1/00
[52] U.S. Cl. .................................... 340/720; 340/733
[58] Field of Search ............... 340/733, 812, 813, 720; 364/724.01, 724.05, 825; 333/165, 166; 358/160

[56] References Cited

U.S. PATENT DOCUMENTS

| | | | |
|---|---|---|---|
| 4,377,793 | 3/1983 | Horna | 333/166 |
| 4,484,188 | 11/1984 | Ott | 340/733 |
| 4,524,422 | 6/1985 | Kasuga | 364/724.2 |
| 4,792,916 | 12/1988 | Benestad | 364/724.17 |
| 4,870,489 | 9/1989 | Ducret | 358/140 |

OTHER PUBLICATIONS

M. A. Sid-Ahmed, "Two-Dimensional Analog Filters: A New Form of Realization", IEEE Trans. on Circuits and Systems, vol. 36, No. 1, pp. 153-154, Jan. 1989.
H. J. Kaufman et al., "2-D Analog Filters for Real Time Video Signal Processing", IEEE Transactions on Consumer Electronics, vol. 36, No. 2, pp. 137-140, May 1990.
J. J. Soltis et al., "Edge Enhancement in Digital Images Using Phase Contrast Filtering", Canadian Journal of Electrical and Computer Engineering, vol. 15, No. 1, pp. 22-26, 1990.
J. Jaggernauth et al., "Real-Time Image Processing by Distributed Arithmetic Implementation of Two-Dimensional Digital Filters", IEEE Trans. on Acoustics, Speech and Signal Processing, vol. ASSP-3, No. 6, pp. 1546-1555, Dec. 1985.
M. J. J. C. Annegarn et al., "Digital Signal Processing in Television Receivers", Phillips Tech. Review 42, No. 6/7, pp. 183-200, Apr. 1986.
J. H. Arbeiter et al., "A Two-Dimensional Real-Time Video Pyramid Processor", RCA Review, vol. 47, pp. 3-31, Mar. 1986.
Venetsanopoulos et al., "High-Speed Architectures for Digital Image Processing", IEEE Transactions on Circuits and Systems, vol. CAS-34, No. 8, pp. 887-895, Aug. 1987.
Soltis et al., "Phase Contrast Filtering for Edge Enhancement in Digital Images", IEEE Pacific Rim Conference on Communications, Computers, and Signal Processing, pp. 73-76, Jun. 1987.

*Primary Examiner*—Jeffery A. Brier

[57] ABSTRACT

A method and an arrangement for realizing true 2-D analog filtering structures of either IIR or FIR type in hardware using only analog devices and line delays. The wide variety of 2-D signal processing techniques that are based on a 2-D transfer function of general order can be implemented. 2-D analog filters are realized in hardware that can directly operate on a raster scanned image without the need for expensive frame stores, A/D and D/A converters. The high-speed operation inherent in the analog nature of the processing makes possible real-time operation at the high data rates of analog raster scanned images, even at high pixel resolution as in HDTV. Many applications involving TV imaging in such areas as advanced television systems, industrial and biomedical video systems are possible.

7 Claims, 11 Drawing Sheets

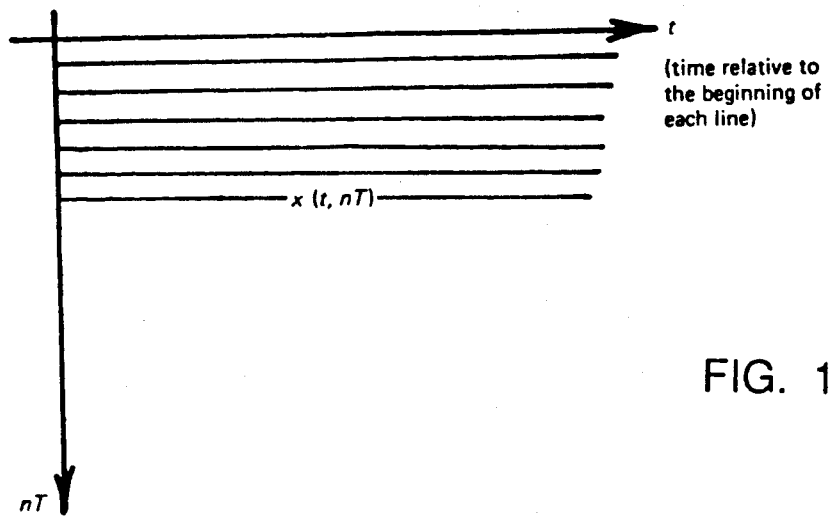
FIG. 1
FIG. 2
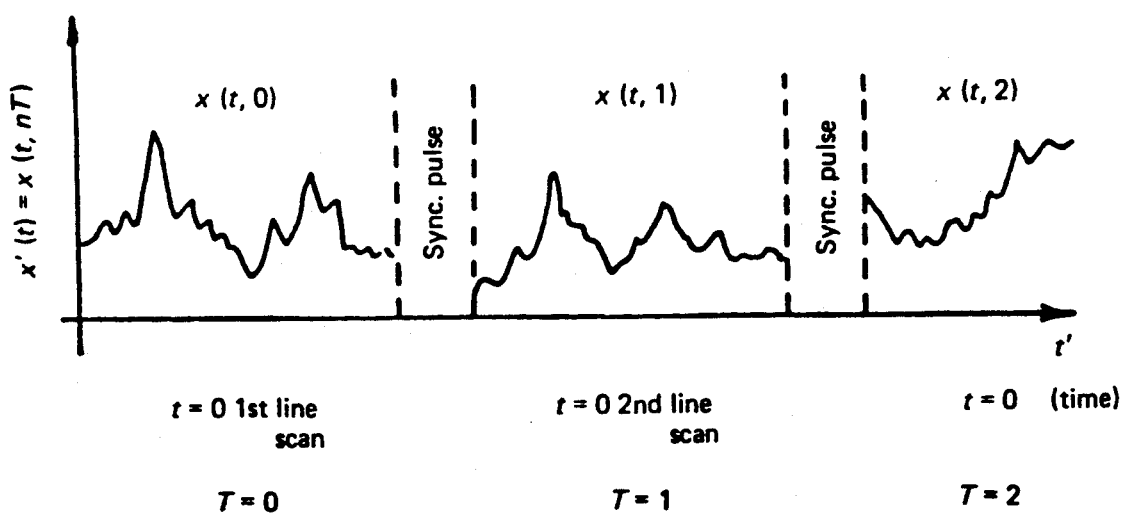

METHOD AND AN APPARATUS FOR 2-D FILTERING A RASTER SCANNED IMAGE IN REAL-TIME

BACKGROUND OF THE INVENTION

In the development of new receivers for television, more advanced signal processing techniques will be implemented in the circuitry of the video processing section. It has been proposed that such advanced video signal processing can be carried out by high-speed two-dimensional (2-D) spatial filtering or by three-dimensional (3-D) temporal filters. See for example, "Digital Signal Processing in Television Receivers" by M. J. J. C. Annegarn, A. H. H. J. Nillesen, and J. G. Raven, Philips Tech. Rev. 42, No. 6/7, 183-200, Apr. 1986. Newer receivers will display pictures that have higher pixel resolution. For what has been termed High Definition Television (HDTV), if the processing is done in real-time, that is, at the same rate as the effective sampling rate of the picture, processing rates as high as 40 million pixels/sec would be required. Methods of deriving high-speed filtering structures cast in the form of practical apparatus, constructed entirely from conventional devices and components, are of current interest not only for application in the area of advanced television systems, but also in the area of biomedical and industrial video applications. Such a method of deriving practical structures together with the characteristic high-speed two-dimensional video signal processing apparatus that results from the application of the method is the subject of the present invention.

In the past analog signal processing techniques such as noise coring, edge peaking, and comb filter separation of luminance and chrominance signals have been based on one-dimensional time domain approaches implemented as simple Finite Impulse Response (FIR) signal processing structures. These have been quite limited as to the type of signal processing and enhancement operations that could be performed by the characteristic type of apparatus that resulted from following that approach. In general, an FIR filter structure will require a higher order signal processing structure than for an equivalent Infinite Impulse Response (IIR) filter structure; hence, the complexity of apparatus that would be required to embody such an FIR structure will be correspondingly greater. The method of the present invention overcomes these limitations by making possible the derivation of true 2-D signal processing apparatus with the real-time capability inherent in analog devices and components, allowing the implementation of the gamut of 2-D filtering techniques in either IIR or FIR structures.

The direct application of techniques for filtering 2-D data, known from the field of Mathematical Image Processing Theory, has been hampered by the difficulty in developing digital filter structures that can be embodied in the form of practical conventional digital hardware apparatus that can operate at the high data rates required for real-time video signal processing. See for example, "High-Speed Architectures for Digital Image Processing", by A. N. Venetsanopoulos, K. M. Ty, and A. C. P. Loui, IEEE Trans. on Circuits and Systems, Vol. CAS-34., No. 8, 887-895, Aug. 1987. Considerations of hardware complexity, physical size of apparatus, power consumption, and economical manufacture are all of vital importance in any practical signal processing apparatus intended for use in consumer products. The present invention overcomes these difficulties by introducing a method and an apparatus in which the two-dimensional s,z transform is used to derive 2-D signal processing structures for performing 2-D signal processing in accordance with given specifications. These given specifications may be those that arise out of the need or desire to implement either well-known or newly derived Image Processing techniques. Those embodiments of 2-D signal processing apparatus derived by the method of the present invention are comprised of line delays, analog summing amplifiers, analog inverting amplifiers, analog integrators and passive components. The use of analog devices make these embodiments inherently capable of real-time operation while remaining practical in light of the above mentioned considerations.

Recently, motion adaptive digital filters have been proposed for use in high-definition television video signal processing. These can be regarded as common 3-D FIR filters, for the implementation of techniques for video signal processing. They require delays of one or more field periods, such delays being accomplished by means of frame-stores. Since pixels in separate fields are combined, this type of signal processing is referred to as temporal filtering and can only be performed on those pixels for which no motion in the scene of the picture being displayed has occurred between fields. Thus the development of such a filter is complicated by the necessary inclusion of circuitry that implements a motion detection algorithm. The embodiments of apparatus arising out of the present invention do not require analog to digital (A/D) and digital to analog (D/A) converters, often used in conjunction with analog pre-filters and post-filters, to convert video signal data from analog raster scanned form to sampled digital data for processing; nor do they require expensive frame-stores or motion detection circuitry.

Other methods of performing real-time 2-D signal processing have been based on elaborate algorithms such as the Burt Pyramid which separates an image into a number of 2-D spatial frequency bandpass images. See for example, "A Two-Dimensional Real-Time Video Pyramid Processor", by J. H. Arbeiter and R. F. Bessler, RCA Review, Vol. 47, 3-31, March 1986. This method, although capable of real-time operation, has the disadvantage of greater complexity relative to the present invention, due to the need to process multiple bands and to generate a set of component images. When embodied in digital hardware, a large amount of circuitry is required along with the need for A/D, and D/A converters.

Aspects of the present invention have been described in the following publications:

1. "Two-Dimensional Analog Filters: A New Form of Realization", by M. A. Sid-Ahmed, IEEE Trans. on Circuits and systems, Vol. 36, No. 1, 153-154, Jan. 1989.
2. "Hardware Considerations for the Considerations for the Realization of 2-D Analog Filters for Processing TV Images in Real Time", by H. J. Kaufman and M. A. Sid-Ahmed, IEEE Trans. on Circuits and Systems, (in press).

SUMMARY OF THE INVENTION

The object of the present invention is to provide a method and an apparatus for two-dimensionally filtering (i.e. signal processing) a raster scanned image in real-time, with either IIR or FIR structures, without the need for expensive digital systems that require A/D and D/A converters. In this method, a raster scanned image is interpreted as a 2-D input signal x(t,nT) consisting of individual horizontal lines occurring in discrete time periods nT.

In accordance with this method, an equation is arrived at which indicates how the output signal is determined in terms of the basic operations of delaying a signal by one or more line scanning periods, multiplications by scale factors, inversions, and integrations. A derived structure in terms of basic operational elements is thus obtained which can be embodied in practical apparatus.

The type of apparatus characteristic of the present invention has advantages in view of considerations of hardware complexity, physical size of apparatus, power consumption and economical manufacture. Moreover, the high-speed operation inherent in the analog nature of the processing makes possible real-time operation at the high data rates of analog raster scanned images, even at high pixel resolution, as in HDTV.

BRIEF DESCRIPTION OF THE DRAWINGS

FIG. 1 is a conceptual illustration as an aid to visualizing the characteristics of a raster scanned signal;

FIG. 2 is a graph of a typical raster scanned signal plotted as a function of time;

DETAILED DESCRIPTION

In general, a two-dimensional (abbreviated as 2-D) image can be described as a function of two independent spatial variables and time in the scene f(x,y,t). The image is converted to an electrical time varying signal for transmission by the process of periodic horizontal scanning. The resulting signal is often referred to as a raster scanned image. To prevent flicker in the display, interlacing is introduced. In other words, the even lines are scanned first, then all the odd lines, producing two alternate fields of lines for each picture frame.

In deriving the method of the present invention, we consider each field of the interlaced picture to be a separate image. Moreover, it must be understood that for the derivation of the method of the present invention, a raster scanned image is interpreted as a 2-D input signal denoted as x(t,nT), consisting of individual horizontal lines occurring in discrete time periods nT, each line being a continuous electrical time varying signal. The corresponding output signal is denoted as y(t,nT). This interpretation of the input signal is explained with reference to FIGS. 1, and 2. The continuous time varying signal within each horizontal line scan is depicted in FIG. 1, wherein t is the time measured relative to the beginning of each line scan. The representation of the signal x(t,nT) occurring as horizontal lines as scanning progresses downward in the vertical direction is depicted in FIG. 2. Here T is the horizontal line scanning period, which is the inverse of the horizontal line scanning frequency, and n is an integer number, representing the number of the line being scanned. In the NTSC television standard presently in use in the United States $T = 63.5 \, \mu s$.

Figure 3:
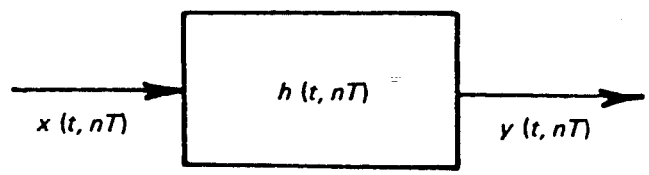
FIG. 3 is a block diagram representing a general linear, time-invariant 2-D signal processing system.

In general, a linear time-invariant 2-D signal processing system (often called a 2-D filter) can be represented by the block diagram of figure of FIG. 3, for which the filtered image y(t,nT) is given by the convolution of x(t,nT) with the impulse response h(t,nT):

$$y(t,nT) = h(t,nT) * x(t,nT) \tag{1}$$

For a linear time invariant system the convolution expression may be written as:

$$y(t, nT) = \sum_{k=0}^{\infty} \int_{x=0}^{\infty} h(x, kT)x(t - x, nT - kT)dx \tag{2}$$

where h(t,nT) is the impulse response of the 2-D filter. The z-transform of h(t,nT) is given by $$H_1(t, z) = \sum_{n=0}^{\infty} h(t, nT)z^{-n} \tag{3}$$

The Laplace transform of h(t,nT) is given by $$H_2(s, nT) = \int_0^{\infty} h(t, nT)e^{-st}dt \tag{4}$$

The s,z transform, H(s,z), is therefore given by:

$$H(s, z) = \sum_{n=0}^{\infty} \left[ \int_{t=0}^{\infty} h(t, nT)e^{-st}dt \right] z^{-n} \quad (5)$$

$$= \sum_{n=0}^{\infty} H_2(s, nT)z^{-n} = \int_0^{\infty} H_1(t, z)e^{-st}dt$$

For a causal 2-D filter a necessary and sufficient condition for stability is $$\sum_{n=0}^{\infty} \int_{t=0}^{\infty} |h(t, nT)| dt < \infty \quad (6)$$

If $H(s,z)$ represents a linear time-invariant system then it can be represented by the transfer function.

$$H(s, z) = \frac{\sum_{i=0}^{N}\sum_{j=0}^{N} a_{ij}s^{-i}z^{-j}}{1 + \sum_{\substack{i=0 \\ i+j \neq 0}}^{N}\sum_{j=0}^{N} b_{ij}s^{-i}z^{-j}} = \frac{Y(s, z)}{X(s, z)} \quad (7)$$

(Note that an FIR (finite impulse response) filter results when all of the $b_{ij}=0$, and an IIR (infinite impulse response) filter results otherwise). Equation (7) can be re-written as follows:

$$Y(s, z) = \sum_{i=0}^{N}\sum_{j=0}^{N} a_{ij}X(s, z)s^{-i}z^{-j} - \sum_{\substack{i=0 \\ i+j \neq 0}}^{N}\sum_{j=0}^{N} b_{ij}Y(s, z)s^{-i}z^{-j} \quad (8)$$

This equation reveals the derived structure of the general 2-D processing system (also described as a 2-D filter) for a system of order $N \times N$. Here N is a general positive integer. Typical orders of such systems are: $1 \times 1, 2 \times 2, 3 \times 3, 4 \times 4$, and so on. Although not typical, it is equally possible, in the present invention, to have systems of order $N \times M$, where N does not equal M, in which case the indices of summation that occur in equations (7) and (8), have independent limits. A derived structure is one that performs integrations, delays of integral numbers of line periods, multiplications by scale factors $a_{ij}$, (respectively $b_{ij}$), (performing signal inversion where necessary for negative scale factors), on both the input signal $X(s,nT)$ and the fed back output signal $Y(s,nT)$, and sums the constituent components obtained by such operations, in accordance with equation (8) to obtain $Y(s,nT)$ the output corresponding to $X(s,nT)$. In this equation s is a continuous variable in the horizontal direction and z is a discrete variable in the vertical direction. Since the horizontal and vertical directions are the basis directions for a 2-D image, the type of signal processing effected is done not only along each horizontal scan line but also in all of the other directions. In equation (8) $s^{-i}$ represents i integrations where i is a positive integer less than N, and $s^0=1$. Also in equation (8), $z^{-j}$ represents j line delays, where j is a positive integer less than N, and $z^0=1$.

Figure 4:
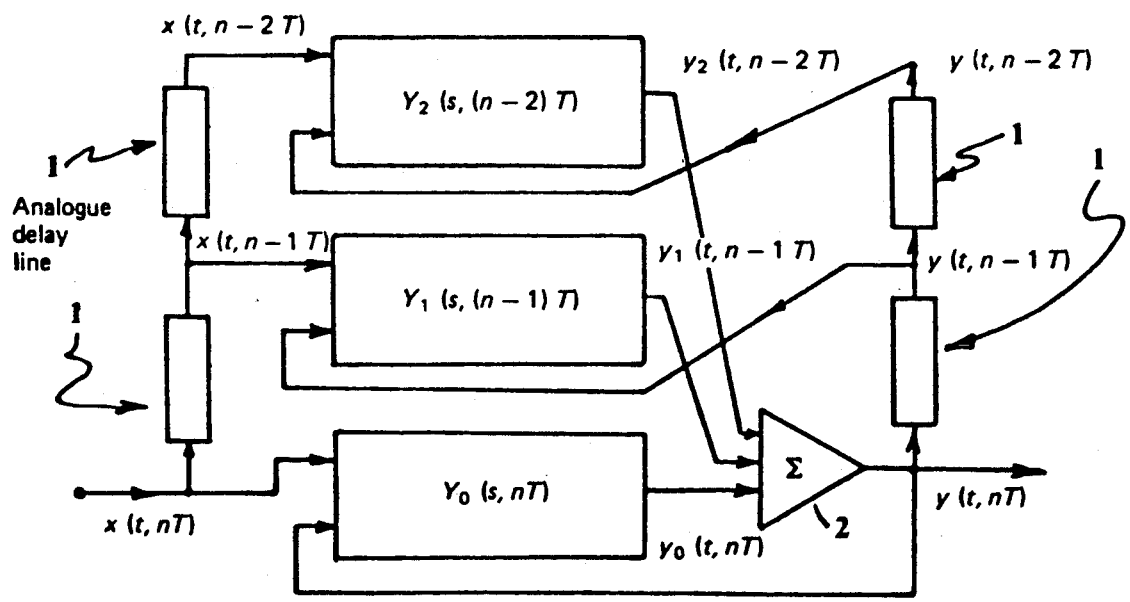
FIG. 4 is a block diagram of a preferred embodiment of the high-speed two-dimensional signal processing apparatus of order $N \times N = 2 \times 2$.
Figure 5:
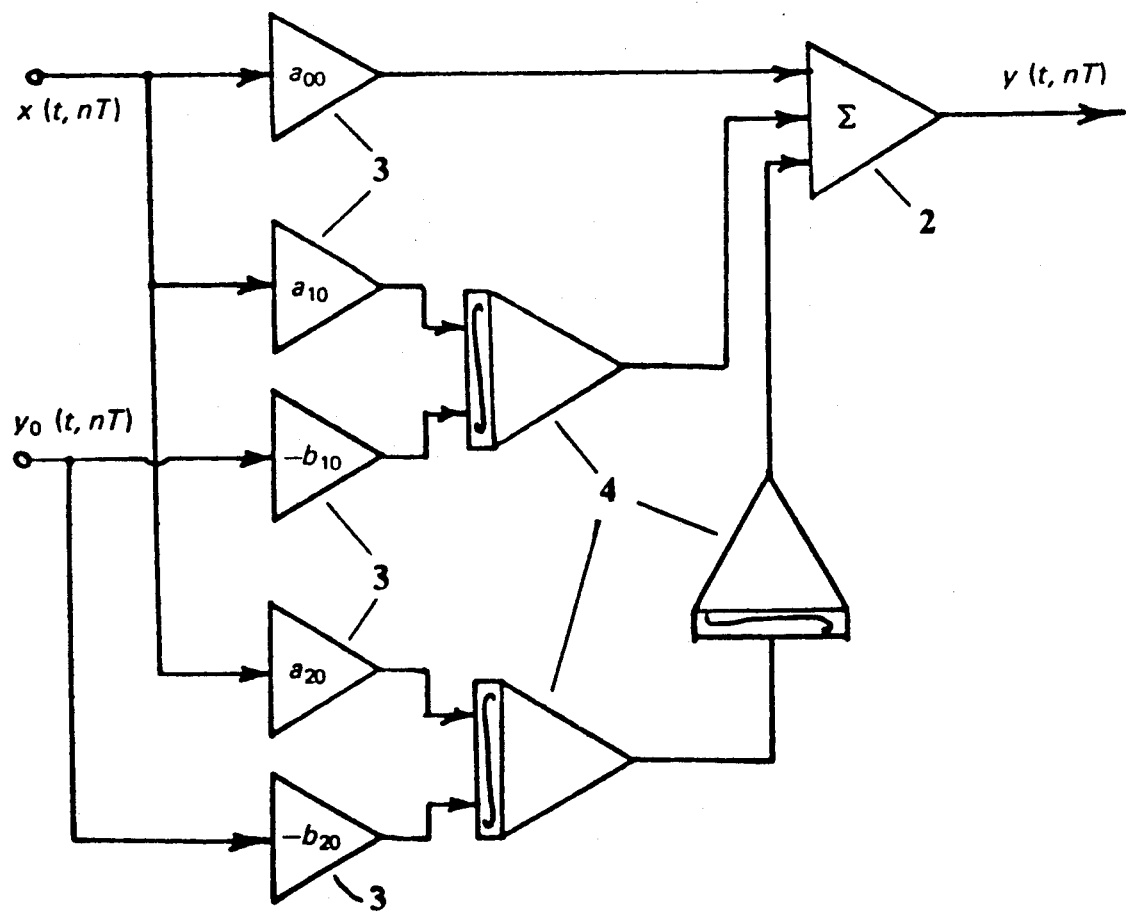
FIG. 5 is a block diagram of a preferred embodiment of one of the subsystem blocks occurring in FIG. 4 (specifically the one for $Y_0(s,nT)$.

The process of deriving a structure and its preferred embodiments in high-speed two-dimensional signal processing apparatus will now be made more clear by illustration for the case wherein the desired filter order is $2 \times 2$ (i.e. $N=2$) with reference to the preferred embodiment as depicted by FIGS. 4 and 5. For a $2 \times 2$ filter, we can write the "line" recursive equation $$Y(s,nT) = Y_0(s,nT) + Y_1(s,\overline{n-1T}) + Y_2(s,\overline{n-2T}) \quad (9)$$

where $$Y_0(s, nT) = \sum_{i=0}^{2} a_{i0}X(s, nT)s^{-i} - \sum_{i=1}^{2} b_{i0}Y(s, nT)s^{-i} \quad (10)$$

$$Y_1(s, \overline{n-1T}) = \sum_{i=0}^{2} a_{i1}X(s, \overline{n-1T})s^{-i} -$$

$$\sum_{i=0}^{2} b_{i1}Y(s, \overline{n-1T})s^{-i}$$

$$Y_2(s, \overline{n-2T}) = \sum_{i=0}^{2} a_{i2}X(s, \overline{n-2T})s^{-i} -$$

$$\sum_{i=0}^{2} b_{i2}Y(s, \overline{n-1T})s^{-i}$$

This leads to the preferred embodiment of the high-speed two-dimensional signal processing apparatus depicted in FIG. 4. The delay lines 1, impart a delay of one horizontal line scanning period (denoted by 1H) and are typically charge-coupled devices (CCD's). Note that this embodiment is simplified because of the way in which $Y(s,nT)$ is obtained by summing the signals output by each of three processing subsystems: $Y_0(s,nT)$ is a function of only the nth line scan, $Y_1(s,(n-1)T)$ is a function of only the $(n-1)$th line scan and $Y_2(s,(n-2)T)$ is a function of only the $(n-2)$th line scan. Each of the processing subsystems $Y_0(s,nT)$, $Y_1(s,(n-1)T)$, $Y_2(s,(n-2)T)$ is embodied in like manner. The preferred embodiment of one of these subsystems, $Y_0(s,nT)$ is depicted in FIG. 5. These processing subsystems differ only as to the particular line scans that are input and output and the coefficient values $a_{ij}$, $b_{ij}$. In FIG. 5 the computational elements are summing amplifiers 2, scale factor multipliers 3, (incorporating invertors for the case where a negative scale factor is required), and integrators 4. The embodied structure for high-speed 2-D signal processing, so derived is inherently capable of processing a raster scanned image in real-time, that is at the same rate as the effective sampling rate of the picture, by virtue of being comprised of analog and other high-speed devices.

The invention will now be further illustrated for the case in which the order of the structure is $1 \times 1$ ($N=1$). Letting $N=1$ in equation (8) we have:

$$Y(s, z) = a_{00}X(s, z) + a_{01}X(s, z)z^{-1} + a_{10}X(s, z)s^{-1} + \quad (11)$$

$$a_{11}X(s, z)s^{-1}z^{-1} - b_{01}Y(s, z)z^{-1} - b_{10}Y(s, z)s^{-1} -$$

$$b_{11}Y(s, z)s^{-1}z^{-1}$$

Figure 6:
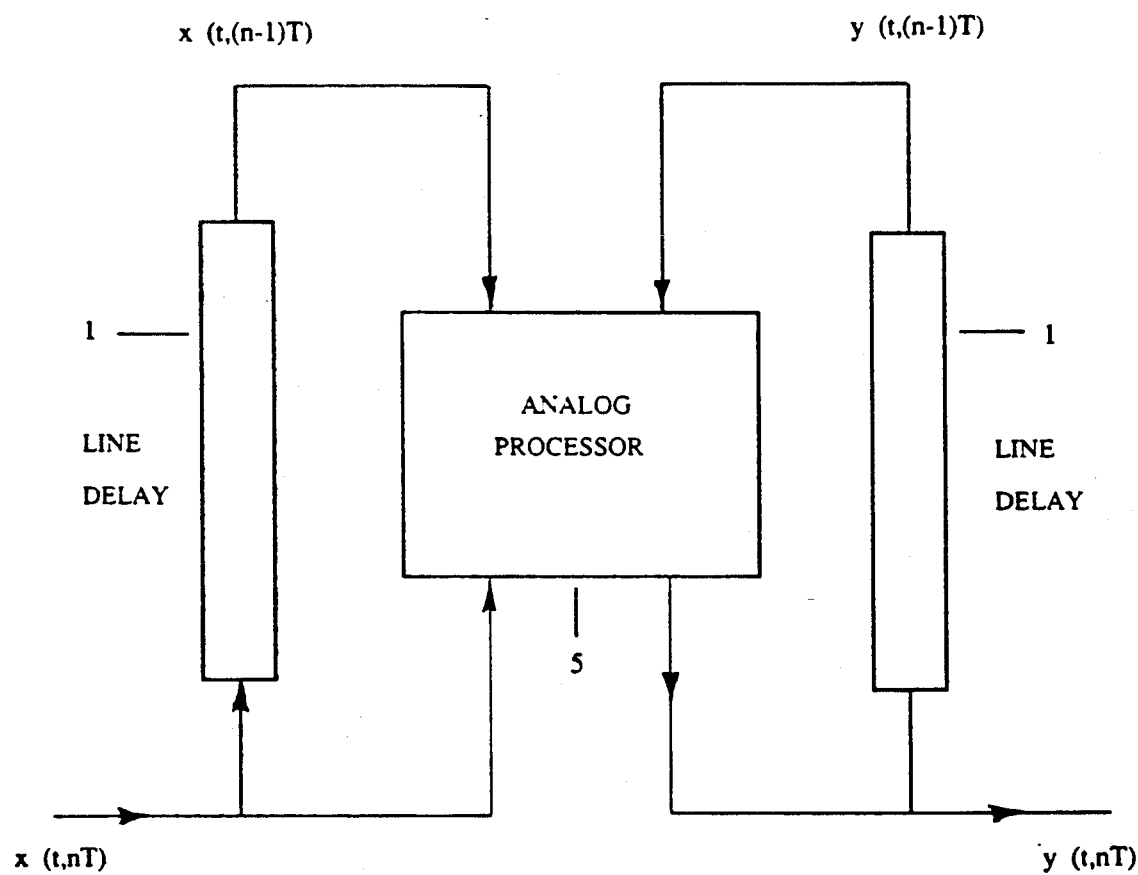
FIG. 6 is a block diagram of the preferred embodiment of the high-speed signal processing apparatus of order $N \times N = 1 \times 1$.
Figure 7:
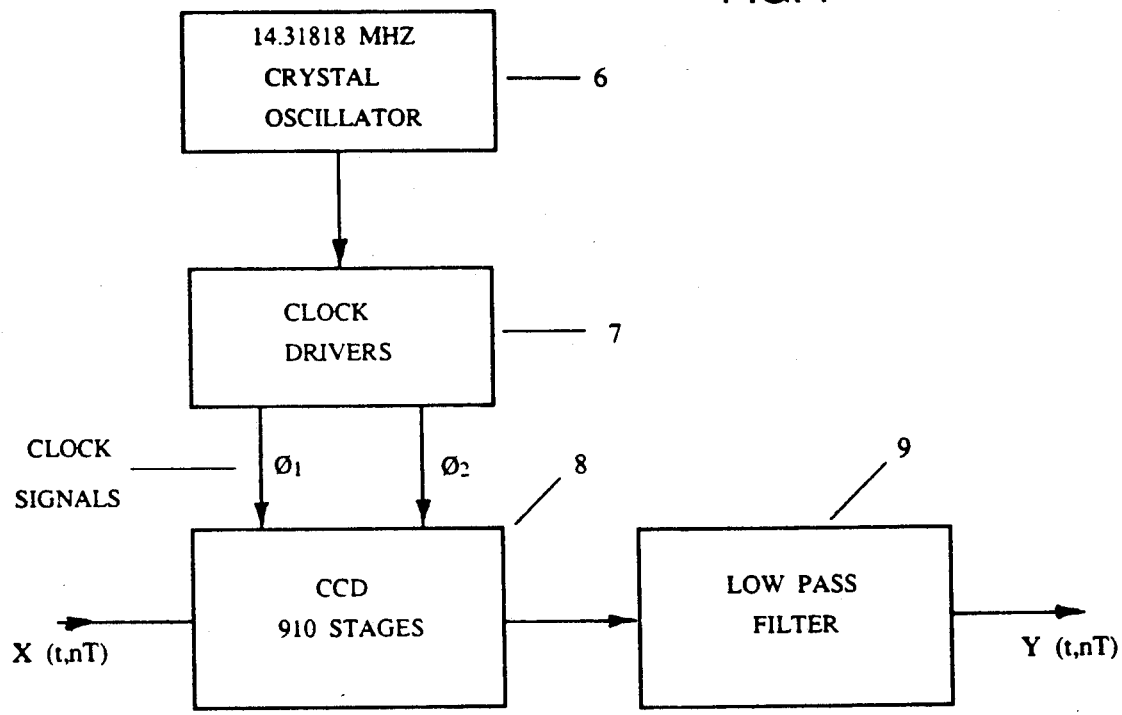
FIG. 7 is a block diagram of a CCD 1H delay line.
Figure 7B:
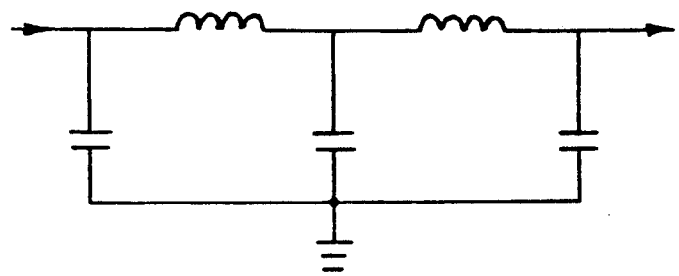
FIG. 7B is a low pass filer circuit used in the circuit shown by FIG. 7.

This leads to a structure that results in the most economical embodiment of high-speed two-dimensional signal processing apparatus characteristic of the present invention as depicted in FIG. 6 being comprised of two 1H signal delay lines 1, and an analog processor 5. Here 1H denotes a time period of one line scanning interval. The 1H signal delay line is typically a charge transfer device (CCD) and is operative to delay signals in the baseband or video frequency range (e.g. 0 to the vicinity of 5 Megahertz). Such devices are commercially available, an example being the Fairchild-Weston CCD321, fabricated in the buried-channel NMOS process. FIG. 7 shows a CCD 1H delay line. The clock system oscillator 7 is typically a crystal controlled oscillator, and is available commercially from many sources. Alternatively, if the system is to operate in a color television receiver, the clock system oscillator signal may be generated by supplying the color subcarrier oscillator (typically 3.58 MHz) to a frequency multiplier circuit to obtain a 14.31818 Mhz clock signal as would be required for a CCD with 910 stages, to obtain a delay of one horizontal line scanning period (1H). The clock signal from oscillator 6, is supplied to clock driver circuitry 7. The type of clock driver circuits used will be a function of the type of charge coupled device being used 8. These circuits will typically be TTL or CMOS family integrated circuit devices arranged to provide a system of two-phase clock signals, $\phi_1$ and $\phi_2$, which are oppositely phased, 50% duty cycle, relatively square waves. These clock signals are suitable for effecting transfer of charge between stages of a charge transfer device type of delay line. In the Fairchild-Weston CCD321, which has a charge injection port at its input and a sample-and-hold circuit in its output amplifier, the two-phase system of clocks $\phi_1$ and $\phi_2$ is applied to the device to effect charge injection at the input as well as interstage charge transport and clocking of the sample-and-hold circuit in the output amplifier. (A sample-and-hold device in the output stage of a CCD is not essential to the operation of the present invention but offers the advantage of reducing the clock frequency components in the signals). The output signal from the CCD is a line delayed version of the input signal, which may contain components of the sampling clock frequencies and its harmonic frequencies. These undesirable frequency components in the output can be suppressed by a 5 MHz low pass filter circuit 9. A passive low pass filter suitable for this purpose based on an arrangement of inductors and capacitors is shown in FIG. 7B. A gain stage can be used in conjunction with such a passive low pass filter to compensate for losses.

A more complex system of clock driver (logic) circuits for charge-coupled devices which has the advantage of reducing noise is described in U.S. Pat. No. 4,158,181, Jun. 12, 1979, by Balopole.

The delay element has been described in a typical embodiment based on the use of a CCD, however, other conventional devices are well-known for being able to produce a delay of 1H; such devices include those that are based on acoustic-wave propagation. Glass block devices which employ acoustic-wave propagation have the disadvantage that thermal changes and long term aging of materials effect the exactness of the value for the delay time that is produced, whereas delay times of charge-coupled devices depend only on the clock frequency which may be precisely controlled.

Figure 8:
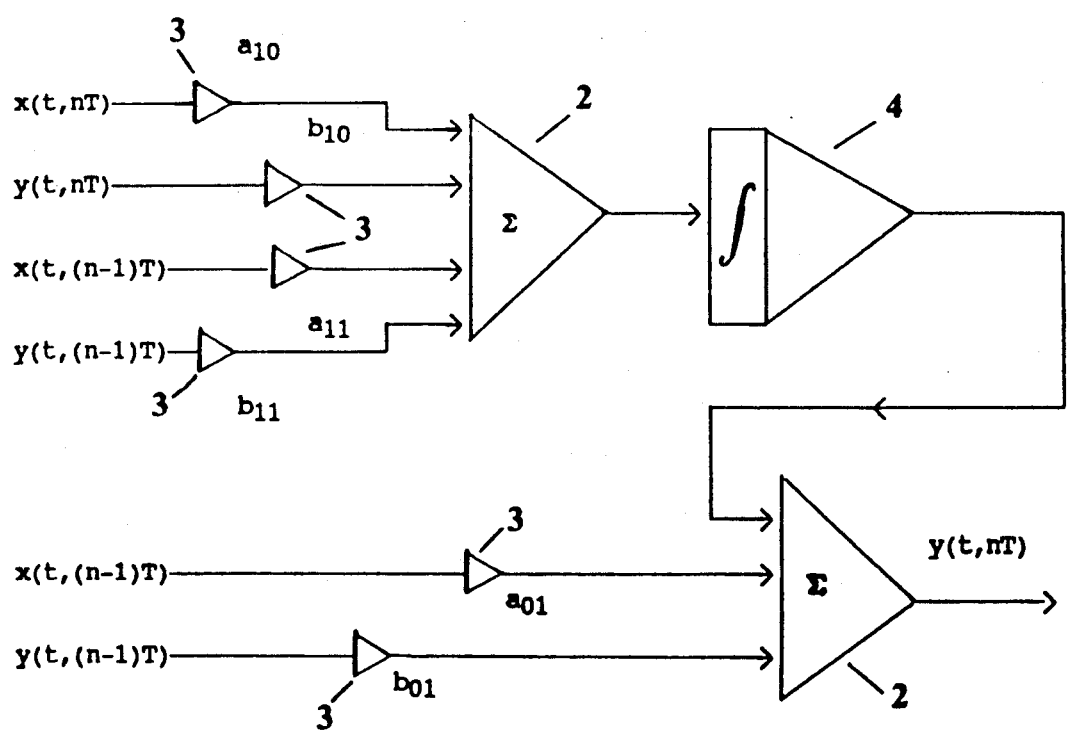
FIG. 8 is a detailed block diagram of the analog processor block of the preferred embodiment given in FIG. 6.
Figure 9:
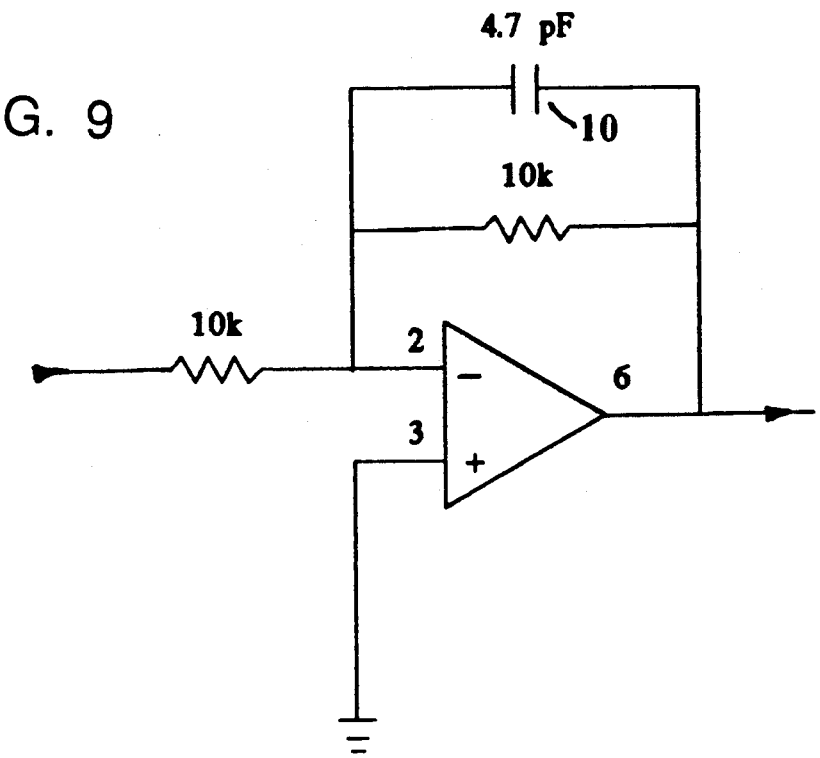
FIG. 9 is circuit diagram of a typical inverting amplifier.
Figure 10:
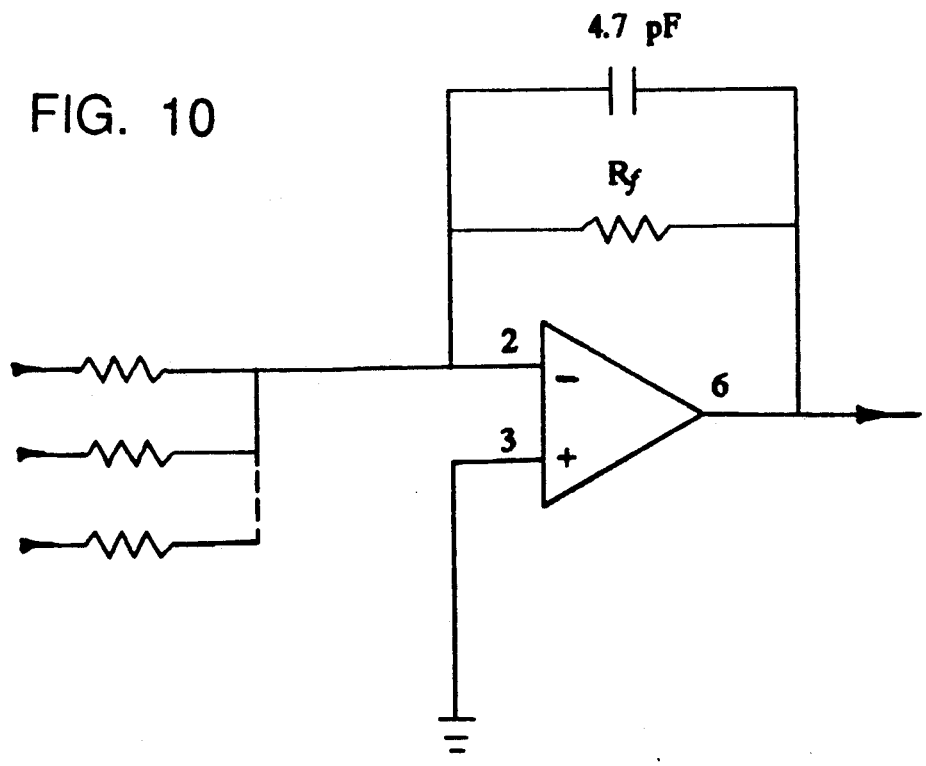
FIG. 10 is a circuit diagram of a summing amplifier as typically embodied.
Figure 11:
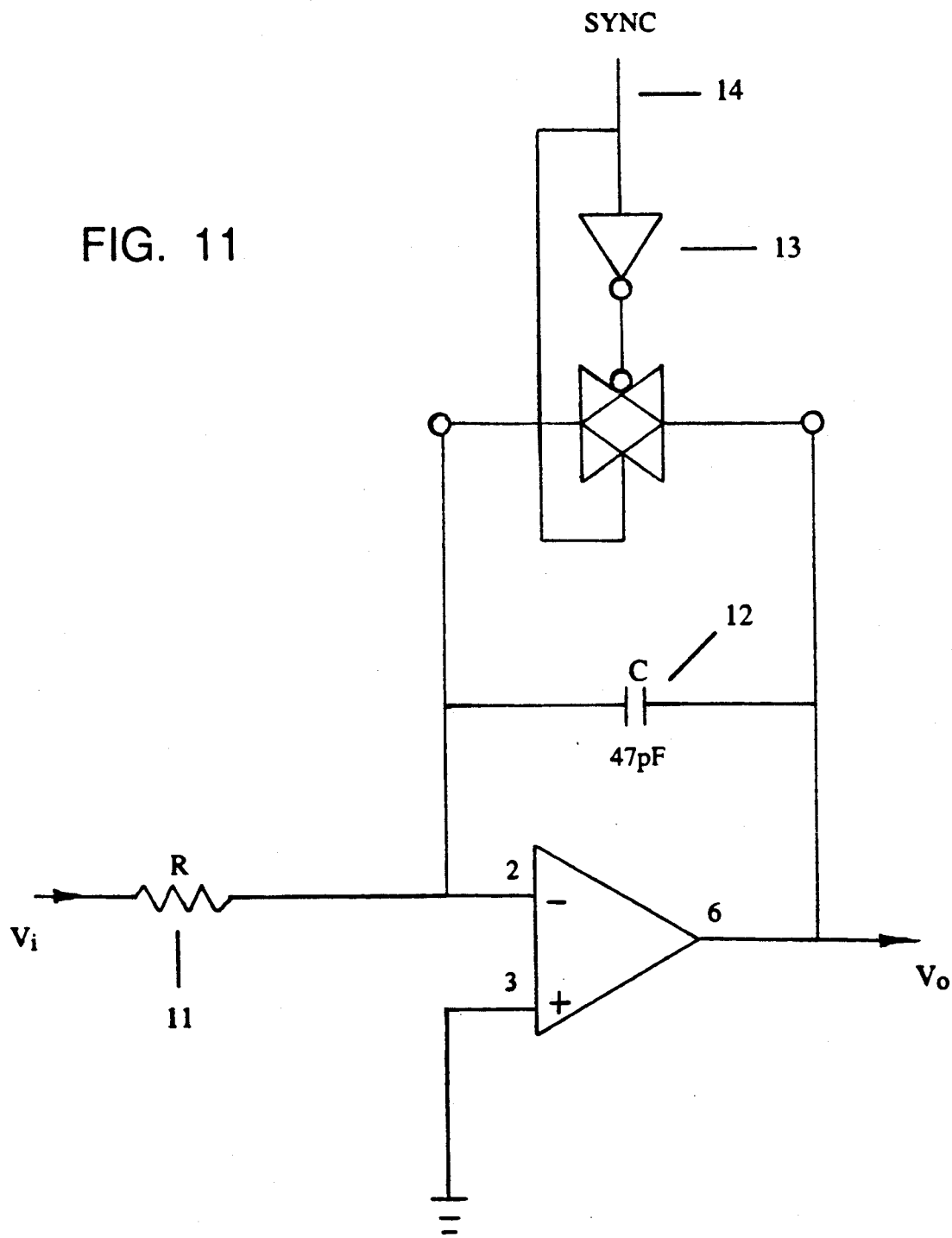
FIG. 11 is a circuit diagram of an integrating circuit as typically embodied.

In the preferred embodiment we are describing, for the case $N=1$, the analog processor contained in the structure of FIG. 6 is depicted in detail in FIG. 8, which indicates how the computational elements, i.e. the analog summing amplifiers (also called summers) 2, scale factor multipliers 3, used with inverting amplifiers (also called invertors) where required, and integrators 4, can be arranged. These computational elements are based on wide-band operational amplifiers that exhibit a bandwidth greater than the video baseband signal range being processed, at the gain setting that is applied by external feedback. Power bandwidth and slew-rate specifications must also be adequate for proper operation. Typical devices are the LM318 wideband operational amplifier (available from National Semiconductor) and the Comlinear CLC220AI. The Comlinear CLC220AI is based on a proprietary current-feedback topology which offers the advantages of eliminating both the gain-bandwidth tradeoff and inherent slew-rate limiting (see the Comlinear 1989 Data Book for computational circuits based on this device). DC offset voltages are added to signals by the DC errors of amplifiers and by bias level shifts. In a signal processing application such as this the signals are AC. Thus AC coupling can be used as a straightforward method of removing DC offset voltages; otherwise offset voltage may be nulled, within the amplifier device itself, by the usual methods. FIGS. 9, 10 and 11 show typical embodiments of the computational elements of the analog processor (FIG. 8) based on a conventional type of wideband operational amplifier such as the LM 318.

An inverting amplifier, typically embodied as depicted in FIG. 9, is required in the analog processor whenever a signal must undergo a sign change with unity gain in order to satisfy equation (11) (and more generally to satisfy equation (8)). As shown in FIG. 9, a 4.7 pF capacitor 10, is required in the feedback loop to prevent oscillations in the output when the wideband LM 318 amplifier is used. The power supplies, $+15$ V are decoupled at pins 4 and 7 with 0.1 $\mu$F capacitors to ground.

The summing amplifier, a special case of the inverting amplifier, is typically embodied as in FIG. 10. The node at pin 2 is the summing node. If the voltages set by scale factor multipliers, (typically attenuators) supplied to the inputs of the summer are $a_1 V_1, a_2 V_2, \ldots, a_n V_n$, the summed output voltage at pin 6 is $-(R_f/10k) (a_1 V_1 + a_2 V_2 + \ldots + a_n V_n)$, for the case of 10k input resistors. A given filter coefficient (one of $a_{ij}$ or $b_{ij}$ in equation (8)) corresponds to the factor $(R_f/10k)a_i$ in the above summation formula. Note that equation (8) may have both sides multiplied by a common scale factor so as to improve the dynamic range in the analog processor. The output signal can be adjusted to an appropriate peak to peak signal level by using an operational amplifier gain stage at the output. The integrating circuit, typically embodied as depicted in FIG. 11, is typically a single pole op-amp circuit. For an input signal $V_i$, the output is given by $V_o = -1/(RC) \int V_i \, dt$, where RC is the time constant determined by resistor 11 (denoted by R) and capacitor 12 (denoted by C). The integrator is set to a zero initial condition at the beginning of each horizontal line scanning period by means of a fast analog switch 13, connected in parallel with capacitor 12, which serves as the storage element of the integrator. The switch is typically of the 4066 type (one of four in the package is used in this case). In order to obtain the said zero initial conditions, the sync pulse which occurs at the beginning of each horizontal line scanning period, is separated from the video signal, limited to 12 Volts peak to peak signal level and applied to the control input 14 of the analog switch.

Figure 12:
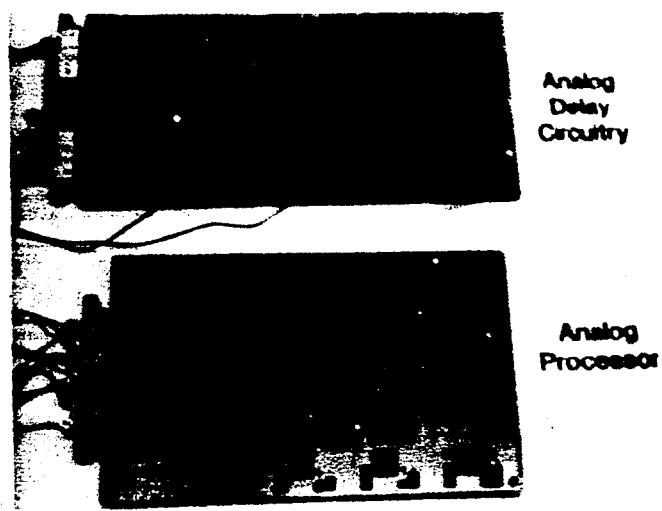
FIG. 12 is a photograph of a prototype of the apparatus of the preferred embodiment of the high-speed two-dimensional signal processing apparatus of order $N \times N = 1 \times 1$.
Figure 13A:
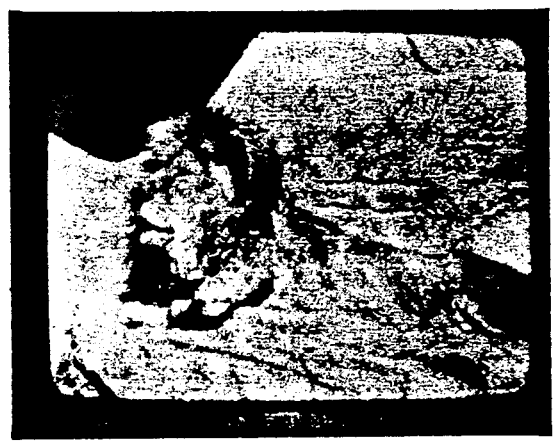
FIG. 13A is a photograph of a television screen image as it appears before filtering.
Figure 13:
FIG. 13B is a photograph of a television screen image of a filtered version of the signal that produced the television screen image of FIG. 13A-the nature of the filtering performed (in this case phase contrast filtering) is due to the numerical values chosen for the set of filter coefficient values.
Figure 14:
FIG. 14 is a photograph showing on the left a television screen image as it appears before filtering, and on the right a filtered television screen image.

A photograph of a prototype of the embodiment of the $1 \times 1$ system ($N=1$ in equation (8)) which just been described is shown in FIG. 12. The circuit board shown above in the photo contains the two 1H delay lines corresponding to 1 in FIG. 6, while the board shown below contains the analog processor circuitry. The photographs in FIGS. 13A and 13B as well as FIG. 14 show the results of implementing an Image Processing filtering technique, known as phase contrast filtering (see J. J. Soltis, M. A. Sid-Ahmed and M. Sradonovic, "Phase Contrast Filtering for Edge Enhancement in Digital Images", IEEE Pacific RIM Conf. on Communications, Computers, and Signal Processing, June 1987). FIG. 13A shows the original broadcast picture photographed from the screen of an unmodified television receiver, while FIG. 13B shows the same broadcast picture photographed at the same time from the screen of a television receiver that was modified by the incorporation of the prototype system of FIG. 12 into its video processing circuitry. The photograph of FIG. 14 demonstrates similar results, the original image shown on the left and the filtered image shown on the right. In these photographs, a filtered image is available at the same time as the original is broadcast because of the real-time 2-D processing capability inherent in the apparatus of the present invention. While it is possible to implement other types of filtering techniques with the method of the present invention i.e. high pass, low pass and many others, the phase contrast technique is presented here for purposes of example. As has been previously stated, the type of filtering technique implemented by the signal processing structure depends on the numerical values chosen for the filter coefficients, i.e. the values of $a_{ij}$ and $b_{ij}$ in equation (8). The coefficient values were set in the prototype by suitable adjustments of scale factor multipliers.

If a transfer function of the type $H(z_1,z_2)$ is known from Image Processing Theory, and the filter coefficients corresponding to given specifications are known, it may be convenient to apply the well known bilinear transformation, given by $$s = \frac{2(z-1)}{T(z+1)}$$

which interrelates the continuous variable s with the discrete variable z, in order to obtain filter coefficients corresponding to a transfer function of the form $H(s,z)$.

Figure 15:
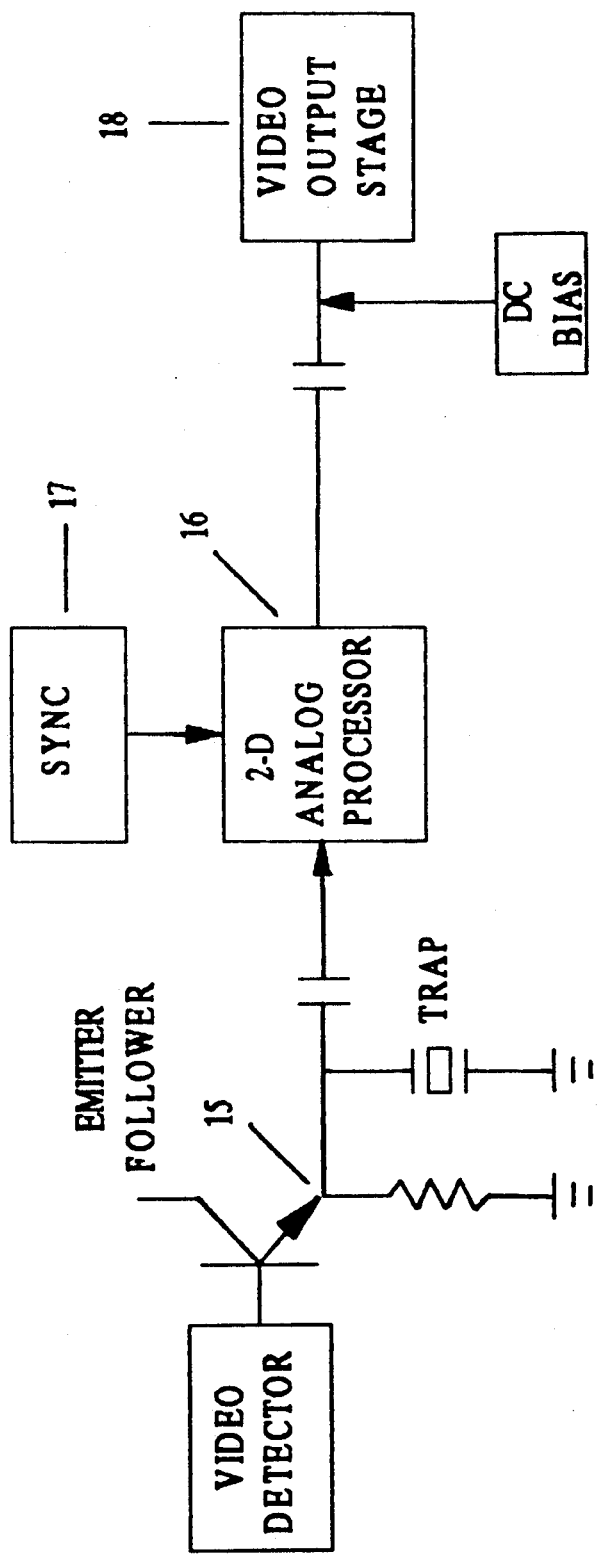
FIG. 15 is a block diagram showing how the high-speed 2-D signal processing apparatus is typically inserted into television video circuitry.

Many applications of the characteristic type of apparatus that result from the method of the present invention are possible. These applications include television raster scanned imaging systems in a diversity of areas, including those of broadcast television, industrial video, and biomedical video. FIG. 15 depicts a simple application in which 2-D signal processing apparatus of the type arising out of the present invention is inserted into the video circuitry of a black and white television receiver. With reference to FIG. 15, the detected video signal available at the emitter follower 15, at approximately a one volt peak to peak level, is supplied (typically AC coupled as shown) to the input of the 2-D signal processing apparatus 16, which in the present context has been labelled as a "2-D Analog Filter" and which implements a given filtering technique. The separated sync signal 17, is brought out from the television receiver circuitry, limited to an appropriate signal level (e.g. 12 V peak-to-peak), and supplied to apparatus 16, in order to provide a signal that controls the resetting of integrators contained within that apparatus, to zero initial conditions, at the beginning of each line scanning period. The output signal of apparatus 16 is supplied to the video output stage 18, of the television receiver circuitry (typically AC coupled as shown), resulting in a 2-D processed (often described as 2-D filtered) image on the TV screen.

The foregoing descriptions of preferred embodiments of the present invention have been presented for the purposes of illustration and description. They are not intended to be exhaustive or to limit the invention to the precise forms disclosed. Many modifications and variations are possible in light of the above teaching. Moreover, it should in no way be construed that the present invention is limited to those applications which involve raster scanned images in the context of a particular standard, which is either existing or envisioned (i.e. NTSC, PAL, etc.).

What is claimed is:

1. A two-dimensional signal processing apparatus for filtering an analog baseband video signal having raster scanned format, that is, said video signal is one being constituted by a plurality of line signals each having a pre-determined line period, said apparatus comprising:

a two-dimensional filter having a transfer function $H(s,z)$ given by $$H(s,z) = \frac{Y(s,z)}{X(s,z)} = \frac{\sum_{i=0}^{N} \sum_{j=0}^{N} a_{ij} s^{-i} z^{-j}}{\sum_{i=0}^{N} \sum_{j=0}^{N} b_{ij} s^{-i} z^{-j}}$$

wherein $\{a_{ij}\}$ and $\{b_{ij}\}$ are the filter coefficients chosen to select the desired two-dimensional frequency response in regards to magnitude and phase, N an integer greater than zero, is a limit of summation corresponding to the order of the filter, s is the standard s-plane variable, z is the standard z-plane variable, $X(s,z)$ is the input signal to said two-dimensional filter and $Y(s,z)$ is the output signal of said two-dimensional filter;

said two-dimensional filter including:

at least one delay line means imparting a delay equal to substantially one horizontal line scanning period of said raster scanned signal;

at least one integrating means for integrating a video signal;

means for setting each of said integrating means to zero initial conditions at the beginning of each line period of said raster scan format;

at least one means for generating a weighted algebraic sum of video signals being input to said weighted sum generating means;

at least one means for inverting a video signal as needed to establish correct algebraic sign of weights in each of said weighted sum generating means;

wherein, said delay line means, said at least one integrating means, said means for setting, said at least one weighted sum generating means, and said at least one video signal inverting means are interconnected to implement said transfer function of said two-dimensional filter.

2. Apparatus in accordance with claim 1 wherein: each of said delay line means is of the charge-coupled device type in which signals transferred internally within said charge-coupled device are in the form of electrical charge representative of said signals.

3. Apparatus in accordance with claim 1 wherein each of said delay line means is of the acoustic wave propagation device type.

4. Apparatus in accordance with claim 1 wherein the order of the filtering is given by N=2.

5. Apparatus in accordance with claim 1 wherein the order of the filtering is given by N=1.

6. Apparatus in accordance with claim 1 wherein the filtering has Infinite Impulse Response signal processing characteristics.

7. Apparatus in accordance with claim 1 wherein the filtering has Finite Impulse Response signal processing characteristics.

* * * * *